United States Patent [19]

Weiner

[11] Patent Number: 4,710,720
[45] Date of Patent: Dec. 1, 1987

[54] ARRANGEMENT FOR TESTING FUSES

[75] Inventor: Hans Weiner, Mühlacker, Fed. Rep. of Germany

[73] Assignee: Dr.Ing.h.c.F. Porsche Aktiengesellschaft, Fed. Rep. of Germany

[21] Appl. No.: 758,373

[22] Filed: Jul. 24, 1985

[30] Foreign Application Priority Data

Jul. 26, 1984 [DE] Fed. Rep. of Germany ....... 3427540

[51] Int. Cl.⁴ ............................................. H01H 85/32
[52] U.S. Cl. ..................................... 324/550; 340/638
[58] Field of Search ............... 340/638, 639, 635, 644, 340/652; 324/133, 51, 52, 550

[56] References Cited

U.S. PATENT DOCUMENTS 1,736,605  11/1929  Kreft ...................................... 324/51
2,882,452  4/1959   Bembenek ........................... 340/639

FOREIGN PATENT DOCUMENTS 1900180   10/1974  Fed. Rep. of Germany .
2940142   4/1980   Fed. Rep. of Germany .
 348453   8/1960   Switzerland ....................... 340/638
2115162   9/1983   United Kingdom .

Primary Examiner—Reinhard J. Eisenzopf
Assistant Examiner—Jose M. Solis
Attorney, Agent, or Firm—Barnes & Thornburg

[57] ABSTRACT

A circuit for testing fuses, especially those of the so-called "little fuse" type, is accommodated in the housing of an electrical component which belongs to a central current distribution system, especially to a central electric system of a vehicle. A simple test arrangement for such fuses is created therewith, whereby this arrangement can be manufactured in a simple and cost-favorable manner and requires no additional space.

10 Claims, 5 Drawing Figures

ARRANGEMENT FOR TESTING FUSES

The present invention relates to an arrangement for testing fuses, especially so-called "little fuses", by means of a test circuit connected to a pair of terminals of a power supply network and consisting of a series circuit including a current limiting resistance, a pair of electrical contacts and an indicating element.

With the fuses of the so-called "little-fuse" type, which are used ever more frequently by reason of their small structural size and their advantageous construction, a defect cannot always be determined unequivocally because the housing openings, respectively, inspection windows of the control of the fuse element have small dimensions and additionally can be inspected only with difficulty in case of dew formation or dirt penetration.

In a known arrangement for monitoring a number of fuses (DE-OS 29 40 142), one light-emitting diode each is connected between a respective fuse and a load on the anode side. These light-emitting diodes are combined on the cathode side by way of a resistance and a switch to be actuated during a test operation.

Disadvantageous with this prior art construction is their high requirement for structural elements or components as well as for the additional wiring expenditure. Furthermore, the operation is complicated because for each testing operation several switches have to be closed. The arrangement is thus expensive, complicated and requires a relatively large amount of space.

It is therefore the task of the present invention to provide an arrangement for testing fuses which is simple in construction, can be readily accommodated from a space point of view and can be manufactured in a cost-favorable manner.

The underlying problems are solved according to the present invention in that the test circuit is arranged at least partly inside of a housing of an electrical component belonging to a central power distribution system, especially to a central electrical system of a motor vehicle.

An eventually defective fuse in the current circuit of a broken-down or non-operating load, for example, in the electrical system of a motor vehicle, can be identified easily because a characterization of the current circuits coordinated to the individual fuses, respectively, of the loads connected in these circuits is necessary anyhow.

Furthermore, frequently a very large amount of unused ("dead") space is present in the housings of electrical components. This is due, on the one hand, to the fact that for different components, for example, of a central electrical system of a motor vehicle, standardized housings are used whereby the component with maximum structural volume determines in each case the housing size; on the other hand, the dead space is frequently needed for a favorable heat removal.

According to the present invention a single, central test place is therefore adequate, on which an assumed defective fuse can be examined for its operability.

The simple test circuit consisting only of a current limiting resistance, of an indicating element and of two electrical contacts requires itself only little space and can therfore be accommodated additionally without problem in a component of a central electrical system, for example in a relay component. Since the test circuit produces only slight amounts of heat during the testing operation, also no thermal problems arise; quite to the contrary, it can be expected that the metallic electrical contacts additionally carry off heat out of the housing interior.

These and other objects, features and advantages of the present invention will become more apparent from the following description when taken in connection with the accompanying drawing which shows, for purposes of illustration only, two embodiments in accordance with the present invention, and wherein.

Figure 1:
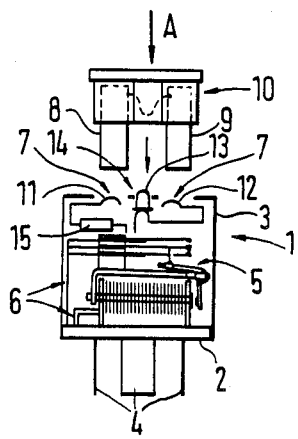
FIG. 1 is a somewhat schematic view of a possible spatial arrangement of the test arrangement according to the present invention in a component of a central electrical system, in the illustrated embodiment of a relay component.

Referring now to the drawing wherein like reference numerals are used throughout the various views to designate like parts, and more particularly to FIG. 1, reference numeral 1 generally designates in this figure a plug-in relay component of a central electrical system, whose housing consists of a base 2 and of a housing cover 3. Male or plug contacts and a centering pin 4 are cast-in into the base 2 on which the elements of the relay component 1 are secured and on which electrical printed conductors are eventually arranged; the relay component is electrically and mechanically connected with the central electrical system by means of the plug contacts and centering pin 4.

A relay generally designated by reference numeral 5 is arranged on the base 2, which is operatively connected with the plug contacts 4 by way of schematically illustrated lines 6. Openings 7 are provided in the housing cover 3, through which the contact elements 8 and 9 of a fuse to be tested and generally designated by reference numeral 10 can be pressed against the electrical contacts 11 and 12. A light diode 13 serving as indicating element is so installed inside of the housing 2, 3 that its light-emitting part at least partially projects out of a further housing opening 14. Furthermore, a current-limiting resistance 15 is connected to the one electrical contact 11. For reasons of ease of understanding, the illustration of the spatial arrangement of the electrical lines and the fastenings of the individual components has been dispensed with in the drawing. The components are secured at the base 2 in an advantageous manner; however, it is also possible that the electrical contacts 11 and 12, the light-emitting diode 13 and the current limiting resistance 15 are secured in the housing cover 3 or are cast together with the same and are electrically connected with the base 2 by way of plug-in or slide contacts (not shown).

Figure 2:
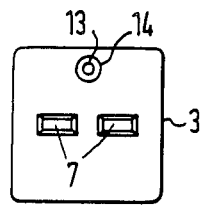
FIG. 2 is an elevational view taken in the direction of arrow A of FIG. 1.

FIG. 2 illustrates the openings 7 of the relay component 1 behind which are arranged the electrical contacts 11 and 12, as well as the housing opening 14 with the light diode 13.

Figure 3:
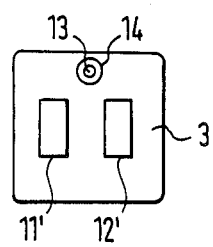
FIG. 3 is an elevational view similar to FIG. 2 of a modified embodiment with electrical contacts arranged on the surface.

A further possible construction of the housing cover 3 according to FIG. 2 is illustrated in FIG. 3, which includes electrical contacts 11 and 12 arranged on the surface of the cover 3. The electrical contacts are constructed as contact-type contacts 11' and 12' and may eventually also be formed raised so that additionally also miniature fuses (microfuses) can be tested, which by reason of their filling with quartz sand are not testable at all optically.

Figure 4:
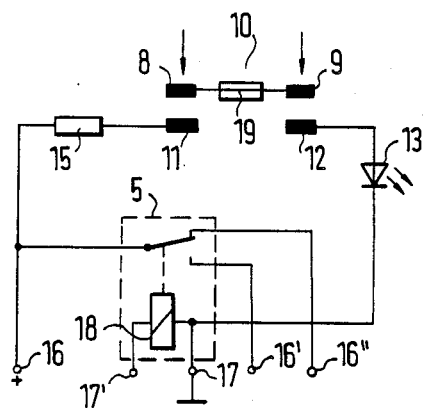
FIG. 4 is a schematic diagram of the circuit of the testing arrangement in accordance with the present invention.

The electrical circuit connections of the components of the test element can be seen from the circuit diagram according to FIG. 4. The electrical circuit is particularly simple with a relay whose non-switched part, terminal 16, of the load circuit, terminals 16, 16', 16" is permanently connected to one terminal of a pair of terminal of an electrical power supply, in this case to the positive operating voltage, and whose non-switched part (terminal 17), of the control circuit, terminals 17, 17' of a relay coil 18 is permanently connected to the other terminal, in this case to ground. A separate current conduction (additional plug-in contacts) for the test circuit can thus be dispensed with.

The one electrical contact 11 is connected to the terminal 16 by way of the current limiting resistance 15 while the other electrical contact 12 is connected with the terminal 17 by way of the light-emitting diode 13. If the electrical contacts 11 and 12 are bridged by means of the contact elements 8 and 9 of a fuse to be tested, then the light-emitting diode 13 lights up in case of an intact fuse; with a burned-out fuse wire 19 the current circuit is interrupted so that the light-emitting diode also remains dark.

Figure 3A:
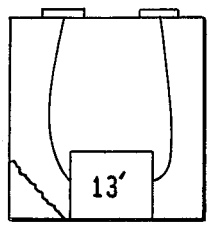
FIG. 3A is a somewhat schematic plan view with portions removed of a modified embodiment of the indicator means

In lieu of a light-emitting diode, it is also possible to utilize as indicating element an electro-optical converter as indicating element which is inserted inside of the housing, whereby the housing cover consists of a transparent material, preferably of a plastic material. Additionally, an electro-acoustical converter 13' in FIG. 3A arranged inside of the housing may also be used as indicating element.

While I have shown and described only two embodiments in accordance with the present invention, it is understood that the same is not limited thereto but is susceptible of numerous changes and modifications as known to those skilled in the art and I therefore do not wish to be limited to the details shown and described herein but intend to cover all such changes and modifications as are encompassed by the scope of the appended claims.

I claim:

1. A fuse testing arrangement for testing fuses in a motor vehicle utilizing an existing current distribution system connected to a relay of said vehicle whereby said relay provides dual functionality and comprises:
   test circuit means for individually and manually testing fuses in the motor vehicle;
   said test circuit means including in a series circuit, a current limiting resistance, a pair of electrical contacts, and an indicating means;
   said test circuit means operable independently and in addition to normal operative functions of the relay.

2. An arrangement according to claim 1, wherein the indicating means is an electro-optical converter inserted inside of a housing means constructed of a transparent material.

3. An arrangement according to claim 2, wherein the transparent material is a plastic material.

4. An arrangement according to claim 1, wherein the indicating means is an electro-acoustic converter.

5. An arrangment according to claim 1, wherein the existing current distribution system belongs to a central electrical system of a motor vehicle.

6. An arrangement according to claim 1, wherein the pair of electrical contacts are arranged inside of a housing means,
   said housing means having at least one opening so that said fuse can contact said pair of electrical contacts through said opening in the housing means.

7. An arrangement according to claim 1 wherein the pair of electrical contacts are constructed as contact-type contacts and are arranged on a surface of a housing means.

8. An arrangement according to claim 1 wherein the pair of electrical contacts are contact-type contacts and are constructed with portions raised above a surface of a housing means so that microfuses can be tested on said contacts.

9. An arrangement according to claim 1, wherein the indicating means is a light-emitting diode.

10. An arrangement according to claim 1, wherein the pair of electrical contacts of the current distribution network are permanently under voltage.

* * * * *